Jan. 28, 1964 J. RABINOW 3,119,273

ADJUSTABLE PRESET TUNING MECHANISM

Filed June 26, 1962 3 Sheets-Sheet 1

INVENTOR

Jacob Rabinow

BY Joseph A. Genovese & Max L. Libman

ATTORNEYS

ADJUSTABLE PRESET TUNING MECHANISM

Filed June 26, 1962

INVENTOR
Jacob Rabinow
BY Joseph A. Genovese & Max L. Libman
ATTORNEYS

INVENTOR
Jacob Rabinow
BY Joseph A. Genovese & Max L. Libman
ATTORNEYS

United States Patent Office 3,119,273 Patented Jan. 28, 1964

3,119,273
ADJUSTABLE PRESET TUNING MECHANISM
Jacob Rabinow, Takoma Park, Md., assignor to Rabinow Engineering Co., Inc., Rockville, Md.
Filed June 26, 1962, Ser. No. 205,442
13 Claims. (Cl. 74—10.39)

This invention relates to mechanisms for precisely repeating mechanical motions, for instance, as required for radio and television channel selection.

Although my invention can be used in many capacities and with numerous devices and equipment, the following description is mainly concerned with radio or television channel selection because these require precise repetitive mechanical movements, especially in the VHF and UHF bands. There have been many mechanisms designed to tune radio receivers where inaccurate repetition in channel selection is undesired, but not as critical as tuning within the higher frequency bands. In general, the repetition accuracy of a mechanical tuning mechanism must be much higher for UHF and VHF tuning than for radio receivers. Thus, ordinary tuning mechanisms commonly used in "push button" radios, and/or as disclosed in many prior patents, for example. U.S. Patent No. 2,340,393 and No. 2,512,243, are considered inadequate.

Mechanical tuners can be made to precisely repeat mechanical motions. But, to accomplish this with prior designs of which I am aware, the mechanism must be made as a fine instrument (constructed to very small tolerances). Even though this may be practical for some applications; where the tuning mechanisms must be produced at a low cost, e.g., for radio and television receivers, manufacturing cost of the mechanisms becomes prohibitive.

Accordingly, an object of my invention is to provide a tuning mechanism with very high repetition accuracy, which can be mass-produced using ordinary manufacturing techniques and procedures.

This objective is achieved by permitting all of the moving parts of the mechanism to be manufactured and assembled to reasonable or even to "large" tolerances, and by including a unique removal of all of the backlash and pertinent clearances in the mechanism. The term "backlash" is used in the ordinary sense, and the term "clearance" is defined as all other lost motion which can effect repetitiveness of tuning.

More particularly, my mechanism has a plurality of channel selectors which are axially moved to the actuated position for selection of a channel. When in the "rest" position and during most of an actuation stroke, my mechanism is uneffected by backlash and clearances. I make no effort to remove backlash and clearances during the major portion of a channel-selection stroke. But at the critical time (when it counts) backlash and clearance are removed from the affected parts of my mechanism. Specifically, components of the force, which operates the channel selector, are used to remove backlash and clearance at the end of a channel selection stroke. At the end of the stroke I have a unique latch which not only latches the actuated channel selector but also maintains the backlash-removing force, and tends to take up clearance in the actuated portion of my mechanism. As a result, it does not matter whether I have little or considerable backlash or whether the clearances are different for each channel selector. Actuation of the individual channel selectors is always accompanied by removal of backlash and clearance independent of the amount thereof. Thus, instead of endeavoring to obtain precise repetitions of a motion by using finely fitted parts, the parts of my mechanism are assembled to reasonable tolerances, and backlash (regardless of reasonable amounts) is removed at the end of each actuation of the tuning mechanism.

Backlash removal is usually accomplished by a split gear. Anti-backlash gearing (e.g., Patent No. 2,663,198) relies on the action of a spring regardless of the nature of the spring, for instance, the torsion bars of Patent No. 2,868,033. My backlash removal is positive-acting which responds to a directly applied force, in contrast to spring force, acting between the split gears of a split gear train. Usual anti-backlash systems are designed to remove backlash continually. In my system backlash is tolerated because it is removed at the end of each channel-selection actuation.

The automatic tuning mechanism disclosed in U.S. Patent No. 2,340,393 uses the channel selection button for fine tuning. In that patent the mechanism can be finely tuned by first pushing a button to select a channel, and then the button can be rotated to move a separate stop axially along a screw for fine tuning adjustment. In my system I use the same button for channel selection and fine tuning. However, fine tuning with my mechanism is quite different, as I fine tune by adjusting the same driving means which are used to effect channel-selection. Further, a feature of my mechanism is that each of its channel selectors is fine-tuned with the channel selector in the actuated position at which backlash and clearances are taken up, thereby increasing the repetition accuracy for subsequent actuations of the trimmed selector.

"Push button" tuning mechanisms have been constructed by the millions in this country, mostly for automobile radio receivers. Each is subject to this deficiency. When the button is pushed "in" for channel selection, the adjacent push buttons are lateral obstructions (on one or both sides) to manipulation of the button. If the same button is used for channel selection and fine tuning, e.g., by axially moving the button for the former, and turning the button for the latter, fine tuning is difficult, and made more so when the fine tuning is critical as in UHF and VHF applications.

Accordingly, another object of my invention is to overcome these problems by providing a "pull button" tuning mechanism, where the actuated element (button) is pulled instead of pushed, thereby having it separated from the non-actuated "buttons" so that it is convenient to rotate for fine tuning.

A number of years ago industry was not nearly as conscious of space requirements as at the present time. For example, a tuning mechanism like that shown in Patent No. 2,251,476, using rockers and oscillating bars to transmit motion from the push button shafts to an output shaft (usually connected with a condenser) was acceptable. Even now, many automobile push button radios use oscillating bars which are actuated upon depression of a push button. It is obvious that oscillating rockers and bars sweep out a comparatively large volume thereby requiring considerable thickness of the mechanism to provide clearance for this motion.

Current demands are for a small tuning mechanism. My mechanism can be made very flat by relying on a pair of essentially flat actuation members as the essence of the mechanical movement of my device. The members preferably slide in adjacent parallel planes to transmit motion from a selected "button" to a main output member, for instance, a gear. The configuration of these members and the way that they are assembled and co-act with the channel selectors enable me to construct my device flat, for instance, of the order of a quarter inch to a half inch thick, and of a width which is practically dictated by the number of buttons and by how close the buttons can be placed and still have them accessible to the user. The elimination of the rocker idea from my tuning mechanism enables my mechanism to have a thin profile so that the mechanism can be placed in a very narrow space, for example, in otherwise waste space in a television receiver cabinet.

My mechanism inherently lends itself to manual tuning as well as "push button" or "pull button" channel selection. In prior mechanisms manual tuning generally requires a rather complex clutch and linkage which operates each time that a channel selector button is pushed. The design of my mechanism makes it possible to manually tune with a comparatively simple sub-assembly which snaps into and out of engagement in a manner almost identical to the channel selectors and which is unaffected by the actuation of a channel selector button. In this regard, even simpler indicators can be used with my mechanism because the position of the above-mentioned actuation members will always correspond to the position of the tuned device (inductor, condenser, etc.). Thus, many conventional or special indicator dials, mechanisms, etc., can be operatively connected to one or both of these members.

Other objects and features of importance will become apparent in following the description of the illustrated form of the invention.

FIGURE 1 is a plan view of my tuning mechanism with the manual tuning device removed.

FIGURES 1*a* and 1*b* are top views of drive members used in my mechanism.

*Preliminary Description*

Figure 1:
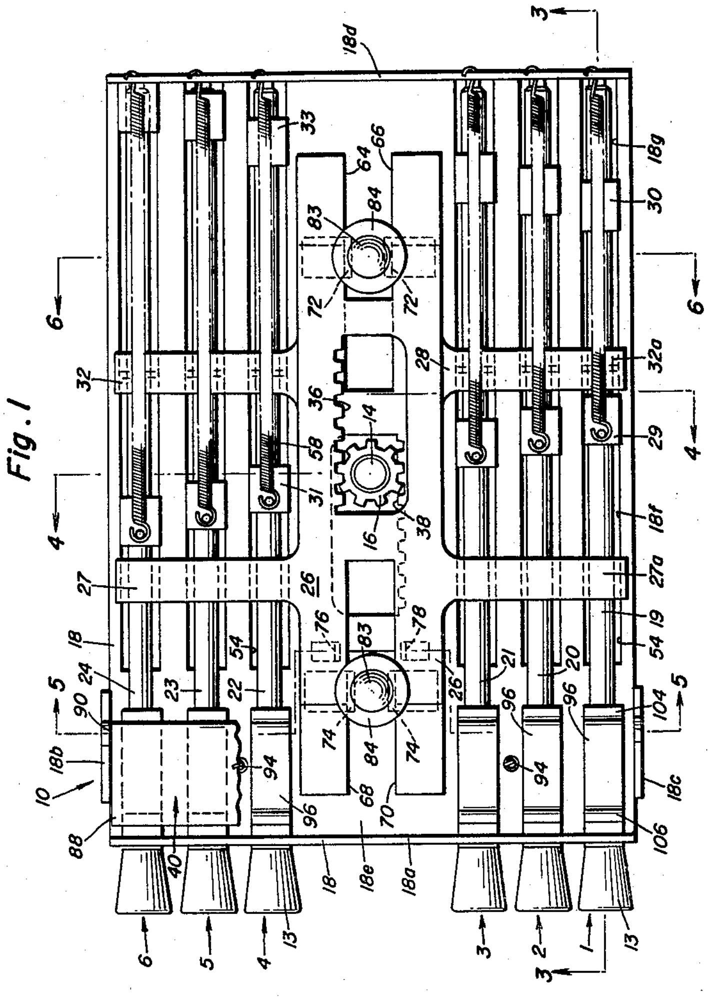
Figures 2, 11, 12:
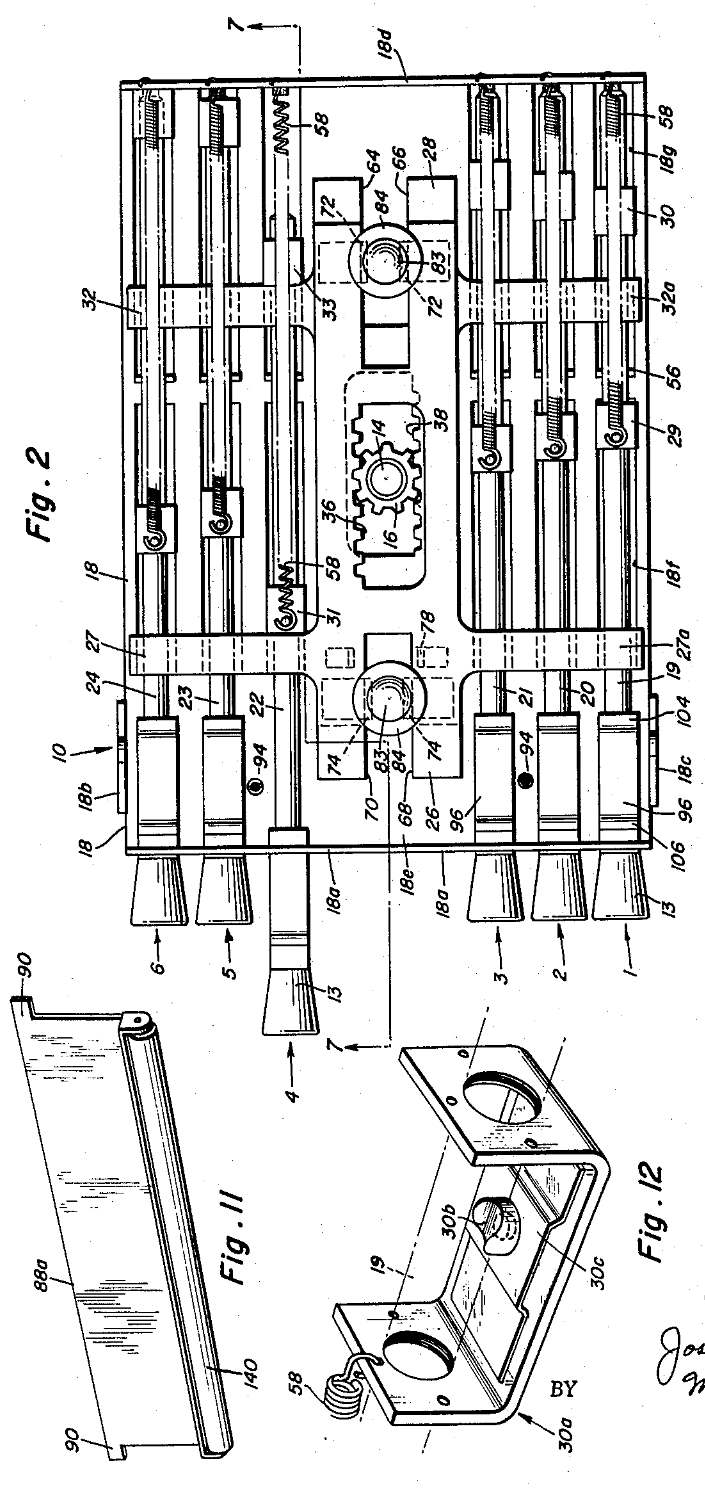
FIGURE 2 is a view, similar to FIGURE 1, but it shows a selector in the actuated position.
FIGURE 11 is a front view of a modified latch bar used with my basic mechanism.
FIGURE 12 is a fragmentary perspective view showing a refined nut assembly as a further modification.

The illustrated tuning mechanism 10 (FIGS. 1 and 2) has six identical channel selectors 1, 2, 3, 4, 5 and 6, although the number of selectors can be increased or decreased. Each channel selector (as the expression is used herein) has a knob 13 (of any kind), and an attached elongate element (FIG. 3) with a pair of nuts thereon, for example screw 19 with nuts 29, 30 of channel selector 1. The channel selectors are axially moved for channel-selection actutaion (FIG. 7) and rotated for fine tuning (trimming). Thus, the frame 18 of my mechanism is designed to support the channel selectors for both axial and rotary motion.

Figure 4:
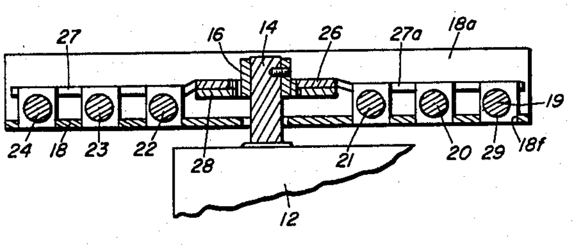
FIGURE 4 is a section view taken on the line 4—4 of FIGURE 1.

Device 12 (FIG. 4) represents the element or subassembly to be tuned, for instance a condenser (or gang thereof) or an inductor (or a plurality thereof). The casing of device 12 is fixed with respect to frame 18, and it has a shaft 14 which is turned for tuning. Gear 16, forming a part of my mechanism, is attached to shaft 14, and upon actuation of one of my channel selectors 1–6, gear 16 is rotated (by means described later) to a predetermined position thereby correspondingly rotating shaft 14 to tune device 12 to any preselected channel-setting. Device 12*a* (FIG. 1*b*) can be tuned in a somewhat different manner, and therefore this alternative arrangement is described much later herein.

*Detailed Description*

Figure 8:
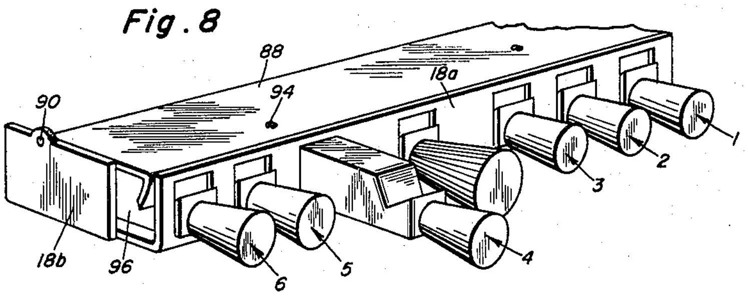
FIGURE 8 is a fragmentary perspective view of the mechanism of FIGURES 1 and 2.

Frame 18 (FIGS. 1 and 2) is the main support for the various parts of my mechanism. It has a front wall 18*a* (FIGS. 1 and 2), small side walls 18*b* and 18*c*, a back wall 18*d* and a bottom wall 18*e*, connected to all of the other walls. The terms "front," "bottom," etc., are used only as a convenience and refer to the device as shown in FIG. 8. For instance, if the mechanism is installed upside down, or on a side, the "bottom" is no longer the "bottom," but this will have no effect on either the principle or the operation of my invention.

Figure 3:
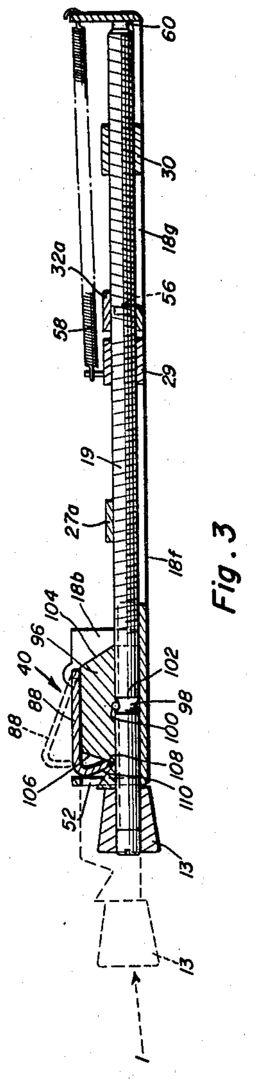
FIGURE 3 is a section view taken on the line 3—3 of FIGURE 1.
Figure 7:
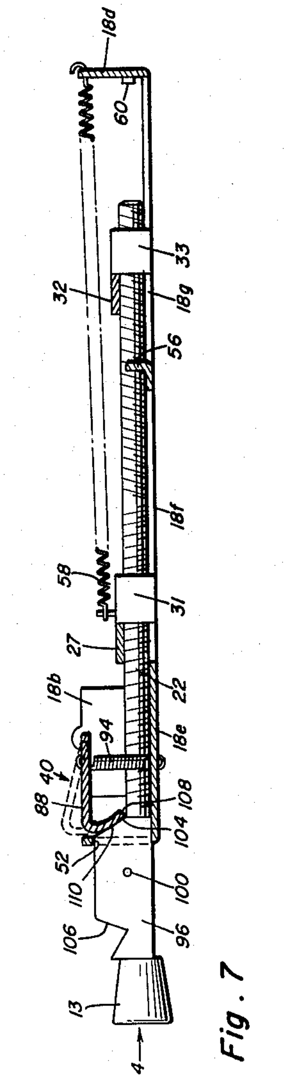
FIGURE 7 is a section view taken on the line 7—7 of FIGURE 2.

The six channel selectors 1–6 include six elongate elements, e.g., screws 19–24, each having a left-hand and a right-hand section (FIGS. 3 and 7). A pair of nuts are threaded on each screw, e.g., nuts 29 and 30 on screw 19, and nuts 31 and 33 on screw 22. The nuts on a given screw are moved with the channel selector when the screw is moved axially, but the nuts move with respect to each other (toward or away from each other) when their screw is rotated. Guide slots 18*f* and 18*g* (FIG. 3) in the bottom of frame 18 allow the nuts to slide fore and aft with the channel selector #1 but prevent the nuts from being rotated thereby enabling them to be adjusted when screw 19 is rotated. In my mechanism it is important that the nuts do not rock appreciably on their screw, and that the screws are not accidently turned during channel selection. Special nuts 30*a* (FIG. 12) can be used to avoid these possible difficulties. Nut 30*a* is a U shaped stamping with tapped, aligned holes in the legs, and a pressure pad 30*b* attached by leaf spring 30*c* to the web of the stamping. When assembled on a screw as shown (or upside down) the force of spring 30*c* presses pad 30*b* (nylon or the like) against the thread on the nut-supporting screw.

The preferred mode of channel selection is to "pull" a selector to the actuated position (FIGS. 7 and 8), and, therefore, I have a return spring 58 attached to back wall 18*d* and to a post, tab, hole, etc., in one of the nuts of each pair. The term "pull" is used to contrast with the term "push" as applied to the usual "push button" configuration. For this reason I prefer to refer to my mechanism as a "pull button" mechanism. As will be seen later, my mechanism can be used as a "push button" device but there are certain advantages in having the actuated selector away from the others. Thus, when a channel selector is pulled (or otherwise motivated) to the actuated position (FIG. 7), it is latched out by latch 40 which is described later because of its close connection with clearance and backlash removal. Actuating any other channel selector will release latch 40 and allow the actuated selector to be returned by its spring 58. Bumper 60 on each screw or on back wall 18*d* arrests the return motion of the released channel selector. I have described how my channel selectors are actuated. Below, I will describe how the movement of the selectors operates gear 16.

My mechanism has two substantially identical drive members 26 and 28 (shown separately in FIGS. 1*a* and 1*b*) which are superposed in adjacent planes (FIGS. 1 and 2), and each member 26 and 28 has a pair (27, 27*a* and 32, 32*a*, respectively) of projections, e.g. laterally projecting arms. The pairs of nuts on one screw co-act with two of these arms when a selected channel selector is pulled axially, (for instance, see nuts 31, 33 engaged with arms 27, 32 in FIG. 7). The nuts are prepositioned on each screw in a manner that both members 26 and 28 will be simultaneously displaced to a pre-determined position depending on which screw is axially pulled, and the positioning of members 26, 28 when the selector is pulled is as follows, using channel selector 4 (FIG. 1) as an example. In the rest position nut 31 is about ½ inch from arm 27, and nut 33 is about two inches from arm 32. These distances are arbitrary in the sense that the previous actuation of mechanism 10 left members 26, 28 in the positions shown. When channel selector 4 is axially moved about ½ inch nut 31 engages arm 27 and begins to slide member 26 toward the front of frame 18. As member 26 moves in this direction, motion is imparted to member 28 but in the opposite direction causing arm 32 to approach the other nut 33 of the pair on screw 22. Finally arm 32 and nut 33 meet, and the nut 33 forms a stop for the rearward motion of arm 32 (member 28). Concurrent motions of members 26 and 28 in opposite directions are caused by the set of gear teeth 36 (in the form of a rack gear along one edge of an opening in member 26) engaging the teeth of gear 16 on one side thereof, and the set of gear teeth 38 along one edge of an opening in member 28 engaging the teeth of gear 16 on its other side. Thus, any time that one of the members 26 or 28 is moved, the other must move, but in the opposite direction. During this phase of actuation, shaft 14 attached to gear 16 rotates to a position that is pre-established by the setting of the nuts of the actuated channel selector, due to the meshing of the teeth of racks 36, 38 with the gear 16.

There is no requirement for precise gears at 16, 36, and 38. The engaging gear teeth can have considerable backlash because backlash is removed at the end of the channel actuation stroke at which the channel selector is latched by means of latch 40. To repeat, as nut 31 moves member 26 toward front of frame 18 and the engaging gears 36, 16, 38 concurrently move member 28 rearwardly, there will be a position at which arm 32 strikes nut 33, i.e., nut 33 forms a stop for arm 32 of member 28. Then, the axial force being applied to the channel selector screw 22 has equal and opposite reaction to the gear 16 thereby removing backlash from between the gear teeth. As will be described later, latch 40 which locks the actuated selector, is designed in a manner that actuation of any one of the other (non-actuated) channel selectors (including the manual tuner in FIGURES 8 and 9) will automatically release the previously actuated (locked-out) channel selector.

Figure 5:
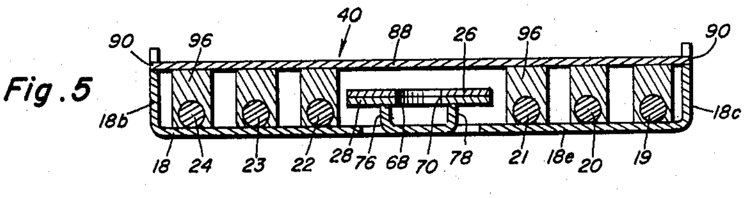
FIGURE 5 is a section view taken on the line 5—5 of FIGURE 1.

Members 26 and 28 are constrained to move in parallel planes by sliding on each other and by additional means described below. The two ends of each member 26 and 28 are slotted, and the inner edges 64, 66 and 68, 70 of the slots serve as guide surfaces to constrain members 26 and 28 to rectilinear motion by contacting front and rear pairs of guide 72, 74 (FIG. 6) struck from bottom wall of the frame. Guides 72, 74 fit between the confronting edges 64, 66 of member 26 and the corresponding confronting edges of the slot of member 28. To further assure rectilinear motion of members 26 and 28, upstanding guides 76, 78 (FIG. 5) are struck from wall 18*e*, and the lower member 28 slides on them. With the described arrangement of guides, any tendency for the members 26 and 28 to cock left or right is overcome. The members are maintained in their horizontal planes by being disposed upon each other and by relying on supporting guides 76 and 78. As a further aid, the arms 32 and 32*a* can rest on screws 19–24. To complete the motion constraining means, I have two rivets 83, screws, or the equivalent, attached to wall 18*e*, and each is provided with a washer 84, enlarged head, etc., which overlies the upper member 26 in the region of the end slots along the center line of each.

Latch 40 (FIGS. 1, 3 and 7) is made of a single latch bar 88 pivoted by means of ears 90, trunnions, etc., at its ends, which are engaged in small openings in the side walls 18*b* and 18*c* of frame 18. The latch bar can be swung up about the axis of the trunnions, against the yielding opposition of one or more springs 94, which are attached to the latch bar and to the bottom of frame 18.

Each channel selector screw 19, 20, 21, etc., has a latch member 96 connected to it by a lost motion connection 98 (FIG. 3), although other equivalent connections may be used. In the illustration, I have a pin 100 in a hole transversely through latch member 96, and a portion of the pin fits loosely in a relieved part 102 of the shank of its screw. Thus, screw 19 can completely rotate with respect to its latch member 96, and the latch member 96 is capable of limited axial movement on its screw 19.

Latch bar 88 has surfaces 108 and 110, respectively, which cooperate with cam surfaces 104 and 106 of latch member 96. When a channel selector screw is in the non-actuated position (FIG. 3), the surfaces 106 and 108 engage loosely. As the channel selector screw is pulled by knob or button 13, surface 108 slides over surface 106 causing the latch bar to be lifted against the opposition springs 94. At this position of bar 88 if any other channel selector is in the actuated (FIG. 7) position, the latch bar will have been lifted from engagement with surface 104 of its member 96, allowing its spring 58 to retract the previously actuated channel selector. As the given channel selector continues to be actuated, surface 108 slides over the top surface of latch member 96 until surface 110 of the latch bar is snapped down against surface 104 (FIG. 7) by the action of spring 94. This takes up the lost motion at connection 98 and retains the actuated channel selector in the "actuated" position. Most important, the springs 94 acting through latch bar 88 and surface 104 of member 96 applies an axial (forward) component of force on the actuated screw, keeping the nuts on the screw pressed against the arms of members 26 and 28 in a manner to keep backlash from between the gear teeth removed, and to retain all affected parts of the mechanism under a clearance-removing load. Somewhat improved operation can be expected by using rolling latch bar 88*a* (FIG. 11) in place of latch bar 88. The difference is that a roller 140 (or a tandem pair) is used in place of cam surfaces 108 and 110 to roll on members 96 (and 96*a*) instead of sliding thereon. The roller 140 has other advantages as longer life, lower manufacturing precision requirements and more favorable geometry in the latch.

I have already mentioned that I originally set up my mechanism to predetermined channels by relative positioning of the nuts on each screw. This is done by merely turning the button. From time to time there may be a need or desire to fine tune any of the channel selectors. With my mechanism this can be done easily, because tuning requires only that the pertinent screw be rotated clockwise or counter-clockwise. The opposite-hand thread sections of the screw will cause both nuts on the single screw to be adjusted toward or away from each other depending on the direction of turning of knob 13. It is important that when an actuated channel selector is in the actuated position, backlash and any and all clearances are removed, so that the fine tuning adjustment takes place with backlash removed. More specifically, when a channel selector is in the actuated position (FIG. 7) the force of springs 94 acting through latch bar 88, latch member 96 and lost motion connection 98, exert an axial force on screw 22 tending to axially move it forward (to the left as shown in FIG. 7). Thus, nuts 31 and 33 bear tightly against arms 27*a* and 32*a* (holding the mechanism under the previously described backlash-removing load). Now, when the knob 13 (FIG. 7) is turned, the nuts 31 and 33 will travel on screw 22 toward or away from each other depending on whether the screw is turned clockwise or counter-clockwise. Assume that the nuts 31 and 33 move toward each other. Nut 31 tends to separate from arm 27*a* while nut 33 tends to move arm 32*a* to the left (as shown in FIG. 7). Concurrent movements of arms 27*a* and 32*a* are assured by racks 36, 38 and gear 16. During these concurrent movements, the gears 36, 16 and 38 are biased under a backlash-removing load by the action of springs 94 pulling latch bar 88 down (cam surface 110 pressing against cam surface 104). Thus, the latch 40 holds screw 22 outward (actuated position) so that when the screw 22 is manually rotated for fine tuning the latch provides the reaction force for the axial adjustment of nuts 31 and 33 on screw 22.

Figures 6, 9, 10:
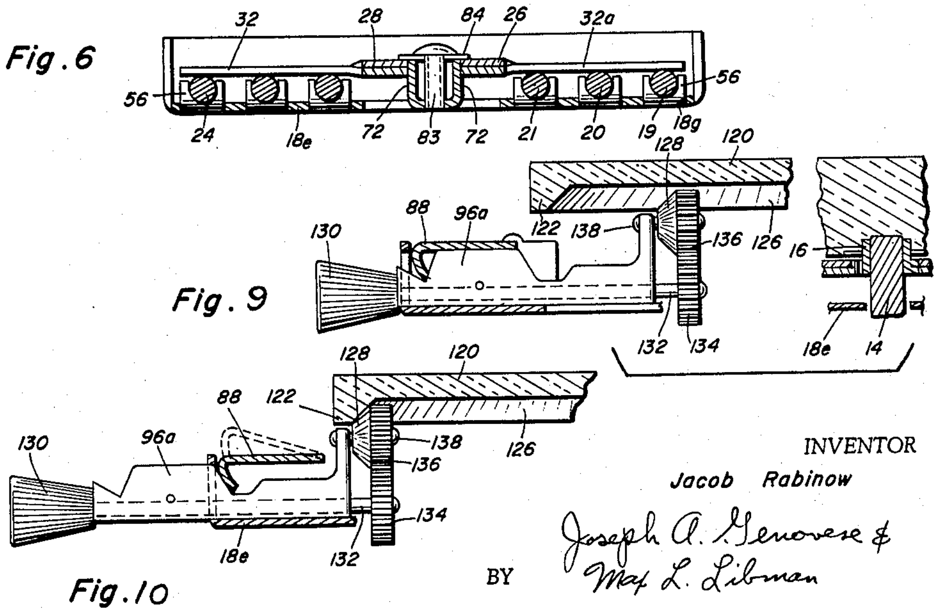
FIGURE 6 is a section view taken on the line 6—6 of FIGURE 1.
FIGURE 9 is a fragmentary sectional view showing a manual tuning feature which can be used with the mechanism of FIGURE 1 or omitted.
FIGURE 10 is a fragmentary sectional view similar to FIGURE 9 but showing the manual tuning feature in the operative position at which it is clutched with an indicator dial.

My mechanism 10 is well suited for normal manual tuning of device 12 should the user desire to do so. Perhaps the simplest method of manual tuning is to use a graduated dial attached directly to gear 16 (or shaft 14) and provide it with an edge which can be reached and pushed to the left or right with the finger or thumb. Another manual tuning method is shown in FIGS. 9 and 10. I have a dial 120 secured to gear 16 and provided with graduations capable of being read from the front of the mechanism. An arcuate skirt 122 depends from the dial and has gear teeth, serrations 126 or a friction (rubber or the like) surface, etc., which is engaged by a corresponding gear, serrated wheel 128, or friction wheel when the manual tuning knob 130 is pulled. Knob 130 has a latch member 96*a* similar to latch members 96. Since the dial 120 must be sufficiently higher than the latch plate 88 to allow it to operate (for instance of the order of a ¼ of an inch), I could use a large gear (not shown) attached to knob shaft 132 or a series of gears 134, 136 attached to shafts 132 and 138 to drive wheel 128. Thus, for manual tuning, the knob 130 and its shaft 132 are pulled so that latch member 96*a* first lifts latch bar 88 (to allow a spring 58 to withdraw any "actuated" channel selector), and then the latch member 96*a* is locked out by latch bar 88. In the locked out position the drive wheel 128 is firmly engaged with surface 126 so that rotation of the manual tuning knob 130 rotates dial 120. Since the dial is attached to gear 16, device 12 will be tuned. Should one wish, knob 130 can be replaced by a two-speed manual driver so that both coarse and fine manual tuning are available. Two speed drivers of suitable types are commercially available.

Figures 1A, 1B:
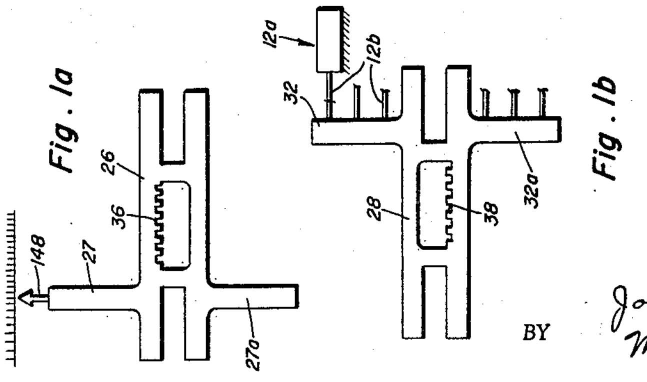

FIGURES 1*a* and 1*b* show my members 26 and 28 apart from the rest of my mechanism for clarity. These figures are also used to show various advantages of my mechanism. Since both members 26 and 28 move to positions which correspond to the adjusted position of the device (12 in FIG. 4) to be tuned, either member 26 or 28 can be used as an indicator. For instance, pointer 148 (FIG. 1*a*) is attached to an arm of member 26 and cooperates with a stationary indicator face (schematically shown by graduations in this figure). This arrangement tends to keep my mechanism compact and flat.

The tuning of device 12 (FIG. 4) is through the gear 16 which acts as an output member for my mechanism. But due to the action of my members 26 and 28 (they assume positions that correspond to the preset channel for which they are adjusted), either makes an ideal driver for the device (12 or 12*a*) to be tuned. Since members 26 and 28 move in substantially straight-line motion, they are ideal for inductive tuning, i.e., operating a slug tuner 12*a*. Thus, FIGURE 1*b* shows a fixed tuner 12*a* with their slugs adjusted by the axial motion of their rods 12*b* attached by any suitable means, to member 28. When either member 26 or 28 is used as an output member (e.g., used to adjust device 12*a*), gear 16 is then only an idler.

A feature of my system, made so by the design of my moving members 26, 28 and their arms, is that my tuning mechanism can be made a "push" instead of "pull" device by using the rear ends (instead of the front end) of the screws to support the push buttons or the equivalent. In either case, my mechanism can be manually operated (shown) or electrically operated by the addition of conventional means such as solenoids.

It is understood that the illustrated mechanism is given by way of example only to explain the principles of my invention. Numerous modifications, alterations, refinements and deviations may be made without departing from the protection of the following claims.

I claim:

1. A tuning mechanism comprising a frame, a plurality of elements movably associated with said frame, a tuning-motion output member, means coupling said elements with said output member to actuate said member to a predetermined position in response to movement of a selected element in a direction to locate the outer end thereof outwardly of the remaining elements, thereby locating said moved element in a position free from lateral obstruction by the adjacent element, and fine tuning means operative upon turning of said moved element.

2. The mechanism of claim 1 wherein said means coupling said elements with said output member include a first drive member and a second drive member, both of said drive members being drivingly connected to said output member, stops on each element, the stops on any selected element actuating said drive members in response to actuation of the selected element to ultimately operate said output member so that the same said drive members service each of said elements.

3. A pull-actuation tuning mechanism comprising a frame, a plurality of elements movably associated with said frame, a tuning-motion output member, means coupling said elements with said output member to actuate said member to a pre-determined position in response to manual pulling of a selected element in a direction to move the outer end thereof outwardly of the remaining elements, means to hold the pulled element in the outward position so that the outer end thereof is free of obstruction by the outer ends of the adjacent elements, and means associated with said output-member actuating means for finely adjusting said output member in response to rotation of said pulled element.

4. In a tuning mechanism of the type having a frame, an output member, and plurality of axially movable elements to operate said output member, the improvement comprising a first and a second member with gear teeth connections between said first and second member and said output member, said gear teeth connections being so arranged that said members are required to move in opposite directions, means including said plurality of selectively axially movable elements to drive one of said members and thereby cause the other member to move in the opposite direction until a pre-determined position of said member is reached at which backlash is removed from said gearing by a binding action therebetween, latch means to latch the selected element and also take up clearance in said drive means, fine tuning means operable in response to rotation of said latched element so that fine tuning is achieved with backlash removed, and the latched position of said selected element being established outwardly of the outer ends of the remaining elements thereby presenting the outer end of said latched element for ease of fine tuning by rotation of the latched element.

5. A precisely repeating channel selector for a tuner comprising a frame, a tuner driver gear connected to said frame, a first and a second substantially flat member, said members being superposed and constrained to move in parallel planes, gear teeth on both of said members and engaging said gear on opposite sides thereof, thereby slaving the motion of one member to the other and requiring said members to move in opposite direction when either is driven, a plurality of elongate elements axially movably supported by said frame, a pair of spaced stops adjustably positioned on each elongate element, one stop engageable with one of said members and the other stop engageable with the other of said members in response to axial movement of the elongate element supporting said pair of stops, the stop which engages a said member first displacing the member which it contacts in its plane thereby causing the other member, through said gear and teeth, to be displaced in the opposite direction until it engages the second stop of said pair so that the force concurrently exerted between both stops by both of said flat members removes backlash from the gearing and also from each affected moving part of the channel selector.

6. The channel selector of claim 5 and a latch to retain the axially actuated elongate element in the axially moved position and retain said flat members under a backlash removing load.

7. The channel selector of claim 6 wherein said elongate elements are screws and said stops are threaded thereon, and each screw when in said axially moved position adapted to be rotated while retained by said latch to thereby adjust the stops while under said backlash-removing load.

8. The channel selector of claim 7 wherein said first and second members are in contact with and slide upon each other to mutually guide each other.

9. The subject matter of claim 5 and a manual tuning element connected with said frame for movement between first and second positions, and means drivingly coupling said manual tuning element to said output member in response to motion of said manual tuning element from its said first to its said second position.

10. A precisely repeating channel selector for a tuner comprising a frame, a first, and a second movable member associated with said frame, means constraining the movement of said members to parallel motion, a plurality of screws both rotatively and axially movable with respect to said frame, pairs of stops on each of said screws, said stops of each pair being selectively positionable along the length of said screws by rotation of said screws, tuner-driver means movably connected with said frame, means drivingly connecting said first and second movable member to said tuner-driver means to operate the latter in one direction in response to movement of said first member in a first direction or movement of said second member in the opposite direction, the stops on one of said screws being so positioned that when said screw is axially moved a first stop displaces one member in one direction thereby causing the other member to move in the opposite direction through said driving connection means and said tuner-driver means until the other stop on said screw is contacted by the second member, upon which contact the forces of said parallel motion members against said stops provides a reaction to remove backlash from all of the operated moving parts of said selector.

11. A precisely repeating channel selector comprising a plurality of screws each having a left and a right hand threaded part, means including a frame supporting said screws for axial movement between actuate and rest positions, a first and a second member movable with respect to said frame, means constraining said movable members to straight-line motion, a gear adapted to provide channel selection output motion, gear teeth on each of said members and engaging said gear, nuts on the respective threaded parts of said screws so that when a screw is rotated the nuts assume different relative positions, one nut on a said screw constituting a driver for said first member when said screw is axially moved thereby linearly moving said first member and through said teeth and gear linearly moving said second member in the opposite direction, the other nut on said screw forming a stop for said member so that the concurrent forces applied to said members by said nuts at the time of the second nut being engaged said second member, are transmitted to said gear in opposite directions thereby removing backlash from the gearing and clearance between the nuts and screw threads.

12. In a tuning mechanism, a frame, a plurality of elongate elements, means mounting said elements on said frame for axial motion from a first inward position to a second outward position to thereby locate the withdrawn end of a selected element outwardly of the others, each element having a pair of spaced stops, an output member, a first and a second drive member superposed relative to each other, means mounting said drive members for relative motion in parallel planes, gearing drivingly connecting said drive members to said output member in a manner such that said drive members are required to move in opposite directions in actuating said output member, said drive members provided with projections, one drive member projection located between the respective stops of said pairs thereof and the other drive member projection located to one side of said pairs of stops by which arrangement of drive member projections and pairs of stops one stop of a said pair will first engage and move one drive member part upon axial withdrawal of the element containing the last-mentioned pair, and upon movement of said one drive member the other drive member is moved through said gearing until the second stop of the pair engages the said projection of the other drive member at which the mutual opposite forces exerted on said drive members remove backlash from said gearing owing to binding therebetween, the same said drive members being operable in a like manner by at least some of the others of said elements and their pairs of stops so that said drive members service more than one of said elements, and the stops of said pairs on said elements being adjustable with respect to each other in response to rotational movement of said elements to selectively adjust the position to which said output member is actuated when a said element is withdrawn to trim said output member when a said element is turned while in the withdrawn position.

13. The tuning mechanism of claim 12 and latch means for latching each of said elements when in the withdrawn position and for exerting a continuing axial force on the latched element in a direction which maintains backlash removed and which also takes up any additional clearances in the actuated parts of the mechanism.

References Cited in the file of this patent

UNITED STATES PATENTS

| | | |
|---|---|---|
| 2,372,099 | McGarvey | Mar. 20, 1945 |
| 2,386,598 | Cramer | Oct. 9, 1945 |